United States Patent [19]
Banerjee et al.

[11] Patent Number: 5,977,560
[45] Date of Patent: Nov. 2, 1999

[54] THIN FILM TRANSISTOR CONSTRUCTIONS WITH POLYCRYSTALLINE SILICON-GERMANIUM ALLOY DOPED WITH CARBON IN THE CHANNEL REGION

[75] Inventors: Sanjay Banerjee, Austin, Tex.; Shubneesh Batra, Boise, Id.

[73] Assignee: Micron Technology, Inc., Boise, Id.

[ * ] Notice: This patent is subject to a terminal disclaimer.

[21] Appl. No.: 08/854,186

[22] Filed: May 9, 1997

Related U.S. Application Data

[63] Continuation of application No. 08/755,152, Nov. 22, 1996, Pat. No. 5,665,981, which is a continuation of application No. 08/447,568, May 23, 1995, abandoned, which is a division of application No. 08/328,097, Oct. 24, 1994, abandoned.

[51] Int. Cl.$^6$ .......................... H01L 29/04; H01L 29/12; H01L 31/036; H01L 29/76
[52] U.S. Cl. .............................. 257/65; 257/19; 257/66; 257/192; 257/616
[58] Field of Search .............................. 257/19, 65, 66, 257/192, 616

[56] References Cited

U.S. PATENT DOCUMENTS

| | | | |
|---|---|---|---|
| 4,885,614 | 12/1989 | Furukawa et al. | 257/616 |
| 4,891,329 | 1/1990 | Reisman et al. | 437/61 |
| 5,166,084 | 11/1992 | Pfiester | 437/40 |
| 5,218,213 | 6/1993 | Gaul et al. | 257/55 |
| 5,240,876 | 8/1993 | Gaul et al. | 437/131 |
| 5,241,193 | 8/1993 | Pfiester et al. | |
| 5,241,197 | 8/1993 | Murakami et al. | 257/192 |
| 5,246,886 | 9/1993 | Sakai et al. | 437/228 |
| 5,268,324 | 12/1993 | Aitken et al. | |
| 5,296,386 | 3/1994 | Aronowitz et al. | |
| 5,323,020 | 6/1994 | Mohammad et al. | 257/19 |
| 5,323,031 | 6/1994 | Shoji et al. | 257/198 |
| 5,324,122 | 6/1994 | Roth et al. | 437/41 |
| 5,354,700 | 10/1994 | Huang et al. | 437/40 |
| 5,442,205 | 8/1995 | Brasen et al. | 257/191 |
| 5,461,250 | 10/1995 | Burghartz et al. | 257/347 |
| 5,479,033 | 12/1995 | Baca et al. | 257/192 |
| 5,527,724 | 6/1996 | Brady et al. | |
| 5,591,653 | 1/1997 | Sameshima et al. | |
| 5,665,981 | 9/1997 | Banerjee et al. | 257/66 |

FOREIGN PATENT DOCUMENTS

| | | |
|---|---|---|
| 1-120069 | 5/1989 | Japan . |
| 4-168769 | 6/1992 | Japan . |
| 4-271126 | 9/1992 | Japan . |
| 4-313242 | 11/1992 | Japan . |
| 4-320063 | 11/1992 | Japan . |
| 5-094929 | 4/1993 | Japan . |
| 5-129635 | 5/1993 | Japan . |
| 5-175538 | 7/1993 | Japan . |

OTHER PUBLICATIONS

Kuo, et al., "Modeling The Effect of Back Gate Bias On The Subthreshold Behavior Of A SiGe–Channel SOI PMOS Device," *Solid–State Electronics*, vol. 36, No. 12, pp. 1757–1761, Great Britain, Dec. 1993.

Eberl, K. "growth and strain compensation in the ternary Si(1–x–y)Ge(x)C(y) alloy system", Appl Phys. lett. vol. 60(24), pp. 3033–3035, Jun. 15, 1992.

Yonehara, et al., "Abnormal Grain Growth In Ultra–Thin Films of Germanium on Insulator", *Mat. Res. Soc. Symp. Proc.*, vol. 25, pp. 517–524, 1984.

Lee, et al., "Characteristic Comparison Between Ge–On–Insulator (GOI) and Si–On–Insulator (SOI) Beam–Induced Crystallization Mechanism," *Mat. Res. Soc. Symp. Proc.*, vol. 74, pp. 577–583, 1987.

Hinckley, et al., "Charged Carrier Transport in $Si_{1-x}Ge_x$ Pseudomorphic Alloys Matched to Si–Strain Related Transport Improvements," *Appl. Phys. Lett.*, vol. 55, pp. 2008–2010, Nov., 1989.

Kesan, et al., "High Performance 0.25 $\mu$m p–MOSFETs With Silicon–Germanium Channels for 300K and 77K Operations," *IDEM Tech. Dig.*, pp. 25–28, 1991.

Nayak, et. al., "Enhancement–Mode Quantum–Well $Ge_xSi_{1-x}$ PMOS," *IEEE Electron Device Letters*, vol. 12, No. 4, pp. 154–156, Apr., 1991.

Nayak, et al., "High Performance GeSi Quantum–Well PMOS On SIMOX," *IEDM Tech. Dig.*, pp. 777–780, 1992.

Nayak, et al., "High–Mobility GeSi PMOS On SIMOX," *IEEE Electron Device Letters*, vol. 14, No. 11, pp. 520–522, Nov. 1993.

Fukami, "Characterization of SiGe/Si Heterostructures Formed by Ge/sup =/ and C/sup =/ Implantation", Abstract, in Appl. Phys. Lett., Nov. 1990.

Yan, et al., "Amorphous Silicon, Germanium, and Silicon–Germanium Alloy Thin–Film Transistor Performance and Evaluation", Appl. Phys. Lett. vol. 50, No. 19, May 1987, pp. 1367–1369.

*Primary Examiner*—Olik Chaudhuri
*Assistant Examiner*—Howard Weiss
*Attorney, Agent, or Firm*—Wells, St. John, Roberts, Gregory & Matkin, P.S.

[57] ABSTRACT

A thin film transistor includes, a) a thin film source region; b) a thin film drain region; c) a polycrystalline thin film channel region intermediate the thin film source region and the thin film drain region; d) a transistor gate and gate dielectric operatively positioned adjacent the thin film channel region; and e) the thin film channel region comprising at least an inner layer, an outer layer and a middle layer sandwiched between the inner layer and the outer layer, the inner layer and the outer layer comprising polycrystalline silicon and having respective energy bandgaps, the middle sandwich layer comprising a polycrystalline material and having a lower energy bandgap than either of the inner and outer layers. Alternately, the channel region is homogeneous, comprising germanium or an alloy of polycrystalline silicon and germanium. A method of increasing the size of individual crystal grains in a polycrystalline silicon alloy includes, a) providing germanium atoms within a layer of polycrystalline silicon to form a polycrystalline silicon-germanium alloy; and b) heating the polycrystalline silicon-germanium alloy to an effective temperature for an effective period of time to cause individual polycrystalline silicon grains within the alloy to increase their size from prior to the heating step.

8 Claims, 2 Drawing Sheets

THIN FILM TRANSISTOR CONSTRUCTIONS WITH POLYCRYSTALLINE SILICON-GERMANIUM ALLOY DOPED WITH CARBON IN THE CHANNEL REGION

RELATED PATENT DATA

This patent resulted from a continuation application of U.S. patent application Ser. No. 08/755,152, filed on Nov. 22, 1996, now U.S. Pat. No. 5,665,981 entitled "Thin Film Transistors" listing the inventors as Sanjay Banerjee and Shubneesh Batra, which is a file wrapper continuation application of U.S. patent application Ser. No. 08/447,568, filed on May 23, 1995, now abandoned, entitled "Thin Film Transistors" listing the inventors as Sanjay Banerjee and Shubneesh Batra, which is a divisional application of U.S. patent application Ser. No. 08/328,097, filed Oct. 24, 1994, now abandoned entitled, "Thin Film Transistors and Method of Promoting Large Crystal Grain Size in the Formation of Polycrystalline Silicon Alloy Thin Films".

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates to thin film transistors and to methods of promoting large crystal grain size in the formation of polycrystalline silicon alloy thin films.

BACKGROUND OF THE INVENTION

As circuit density continues to increase, there is a corresponding drive to produce smaller and smaller field effect transistors. Field effect transistors have typically been formed by providing active areas within a bulk substrate material or within a complementary conductivity type well formed within a bulk substrate. One recent technique finding greater application in increasing packing density is to form field effect transistors in thin films which are vertically stacked on top of transistors in the bulk material, thus resulting in 3-D integration. This is commonly referred to as "thin film transistor" (TFT) technology.

With TFTs, a thin film of semiconductive material is first provided. A central channel region of the thin film is masked, while opposing adjacent source/drain regions are doped with an appropriate p or n type conductivity enhancing impurity. A gate insulator and gate are provided either above or below the thin film channel region, thus providing a field effect transistor having active and channel regions formed entirely within a thin film, as opposed to utilizing bulk substrate material.

One common material utilized as the thin source, channel and drain film in a TFT is polycrystalline silicon. Such is composed of multiple orientations of individual single crystal silicon grains. The location where two individual crystalline grains abut one another is commonly referred to as a grain boundary. Grain boundaries are inherent in polycrystalline materials, such as polycrystalline silicon, as it is the boundaries which define the breaks between individual crystal grains. In a silicon lattice (or single crystal silicon), a silicon atom inherently tries to bond to four other silicon atoms. In polycrystalline silicon, the lattice structure breaks down at the grain boundaries giving rise to silicon atoms with dangling bonds. A collection of these dangling or "broken" bonds for a given crystal runs along a plane which defines the boundary for that crystal.

Conductivity in doped polycrystalline silicon, which is an overall function of carrier mobility, inherently depends upon the grain boundary trap density. The lower the grain boundary trap density, the greater the carrier mobility and accordingly the conductivity. Grain boundaries adversely affect inherent conductivity of the material due to the presence of a potential barrier at the grain boundaries which arises from carrier trapping. This barrier degrades conductivity by impeding the flow of carriers in an applied field. The greater the number of boundaries, the lower the conductance or the higher the resistance. Also, the larger the average crystalline grain size, the lower the total number of grain boundaries. Accordingly, the larger the crystal size, the greater the inherent conductivity of the polycrystalline material for a given doping concentration.

Unfortunately, it is typically easier to more uniformly control material properties the smaller the processor attempts to make the polycrystalline grains. Alternately considered, although lower resistance results from larger grain size, it is more difficult to uniformly and consistently control resistivity the larger one tries to make the crystals.

Grain boundaries also affect a property known as "current leakage". Current leakage in a polycrystalline silicon thin film transistor is referred to as the source-to-drain current in the off state. Current leakage in a polycrystalline silicon thin film transistor is principally a function of the unbonded regions of silicon which are inherent in grain boundaries, and are commonly referred to as "traps". The term "traps" derives from these unbonded or unpaired electrons of a silicon atom which "trap" carriers and prevent them from conducting. However, these "traps" present at grain boundaries facilitate current leakage through the material. Accordingly, the greater the number of grain boundaries (i.e., the smaller the grain size), the greater the current leakage through the material despite the material having inherent overall lower conductivity. Current leakage causes the SRAM cell to consume more power in the standby-state since the leakage has to be supplied from a power source. Such leakage is particularly adverse in laptop computers, where desired power consumption when a cell's state is not being changed should be very low to extend the battery life.

Polycrystalline thin films are typically deposited by low pressure chemical vapor deposition which inherently results in a high density of grain boundaries. Also, the interface between the polycrystalline silicon and the gate oxide produces a large number of defects, resulting in a high interface state density. These defects degrade transistor performance in terms of high subthreshold slope and leakage current. This, in turn, has deleterious effects on the standby power dissipated in the integrated circuits incorporating these devices.

It would be desirable to improve upon prior art thin film transistor constructions and polycrystalline thin films.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a thin film transistor comprises:

a thin film source region;

a thin film drain region;

a polycrystalline thin film channel region intermediate the thin film source region and the thin film drain region;

a transistor gate and gate dielectric operatively positioned adjacent the thin film channel region; and the thin film channel region comprising at least an inner layer, an outer layer and a middle layer sandwiched between the inner layer and the outer layer, the inner layer and the outer layer comprising polycrystalline silicon and having respective energy bandgaps, the middle sandwich layer comprising a polycrystalline material and having a lower energy bandgap than either of the inner and outer layers.

In accordance with another aspect of the invention, a method of increasing the size of individual crystal grains in a polycrystalline silicon alloy comprises the following steps:

providing germanium atoms within a layer of polycrystalline silicon to form a polycrystalline silicon-germanium alloy; and heating the polycrystalline silicon-germanium alloy to an effective temperature for an effective period of time to cause individual polycrystalline grains within the alloy to increase their size from prior to the heating step.

Figure 1:
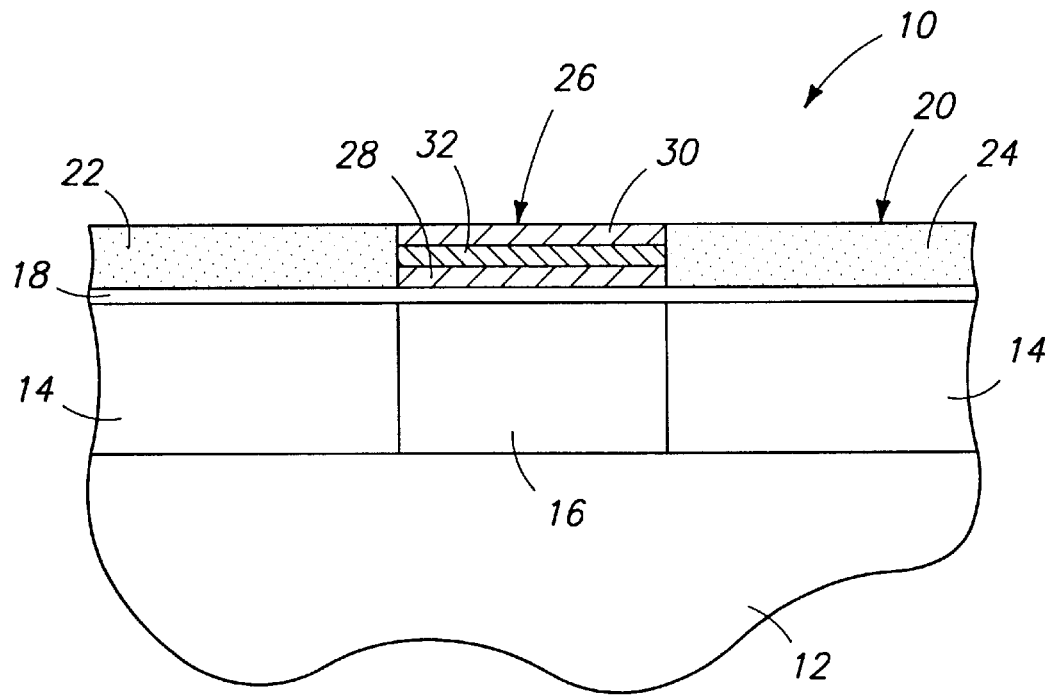
FIG. 1 is a diagrammatic side sectional view of a semiconductor wafer fragment in accordance with the invention.

More particularly and in reference first with FIG. 1, there illustrated is a semiconductor wafer fragment indicated generally by reference numeral 10. Such is comprised of a bulk semiconductor substrate 12 and an overlying insulating oxide layer 14. Provided within oxide layer 14 is a transistor gate 16. A gate dielectric layer 18 overlies insulating layer 14 and gate 16.

A thin film transistor layer 20 is provided atop gate dielectric layer 18. Such is comprised of a thin film source region 22 and a thin film drain region 24. A polycrystalline thin film channel region 26 is provided intermediate thin film source region 22 and thin film drain region 24. Accordingly, transistor gate 16 and gate dielectric layer 18 are operatively positioned adjacent thin film channel region 26. Source and drain regions 22 and 24 are preferably the same film as the thin channel film which has been p-type doped (e.g., with $BF_2$) to an example dose of $5 \times 10^{14}$ atoms/$cm^2$.

Thin film channel region 26 comprises an inner layer 28, an outer layer 30, and a middle layer 32 sandwiched between inner layer 28 and outer layer 30. Example thicknesses for each of layers 28, 30 and 32 are 150 Angstroms. Inner layer 28 and outer layer 30 comprise polycrystalline silicon material, which is preferably lightly conductively doped with a n-type implant to an example dopant dose of $1 \times 10^{12}$ atoms/$cm^2$. The materials of layers 28 and 30 will have relatively high energy bandgaps. Preferably, inner and outer layers 28 and 30, respectively, are comprised of the same material (polycrystalline silicon), and accordingly possess the same energy bandgap (i.e., 1.1 eV).

Middle sandwiched layer 32 comprises a polycrystalline material and has a lower energy bandgap than either of inner and outer layers 28 and 30, respectively. An example and preferred polycrystalline material is an alloy including silicon and germanium. Germanium is preferably present in the alloy at from 20 to 45 atomic percent, with a range of from 20 to 30 atomic percent being most preferred. Polycrystalline silicon-germanium alloy layer 32 has a lower energy bandgap than conductively or lightly doped polycrystalline silicon. Furthermore, the band-edge discontinuity for the polycrystalline silicon-germanium system is primarily in the valence band. This is ideal for p-channel poly thin film transistors for confining the holes within layer 32 in the middle, away from the high defect density poly-oxide interfaces. The result is lower leakage current and sharper sub-threshold slopes. Elemental germanium also inherently has a lower energy bandgap than polycrystalline silicon. Accordingly, middle layer 32 might also be provided to consist essentially of elemental germanium.

The material of layers 28 and 30 might also comprise a polycrystalline silicon-germanium alloy having from 5 to 7 atomic percent carbon. This effectively raises the band-gap over that of a pure polycrystalline silicon-germanium alloy, which would still then be usable for layer 32.

Figure 2:
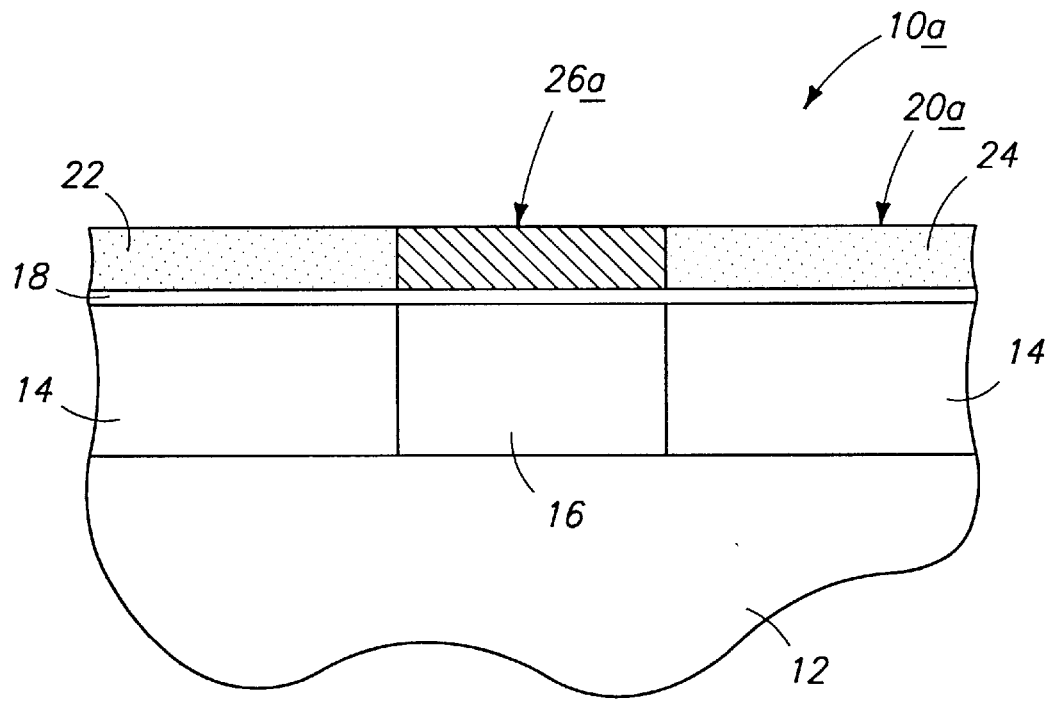
FIG. 2 is a diagrammatic side sectional view of an alternate semiconductor wafer fragment in accordance with the invention.

FIG. 2 illustrates an alternate embodiment thin film transistor 10a in accordance with the invention. Like numerals from FIG. 1 have been utilized where appropriate, with differences being indicated by an "a" suffix. Thin film transistor 10a constitutes a homogeneous polycrystalline thin film channel region 26a which comprises, and preferably consists essentially of, a polycrystalline silicon and germanium alloy as described above. Alternately, homogeneous polycrystalline thin film channel region 26a could comprise, or preferably consist essentially of, polycrystalline germanium. Regardless, each construction provides lower leakage current and sharper sub-threshold slopes, which is highly desirable.

The above channel regions might be provided in a number of possible ways. Germanium atoms are larger in comparison to size of silicon atoms, and accordingly desirably induce stress into the initially formed layer. Such stress will precipitate stress-enhanced grain growth of the individual polycrystalline grains. Increased grain growth results in lower grain boundary density, and correspondingly desired lower leakage current. Accordingly, a method of increasing the size of individual crystal grains in a polycrystalline silicon alloy in accordance with the invention includes the provision of germanium atoms within a layer of polycrystalline silicon to form a polycrystalline silicon-germanium alloy. This could be accomplished in one of at least two ways.

In a first method, chemical vapor deposition and preferably low pressure chemical vapor deposition is utilized. Preferred reactive feed gases are silane ($SiH_4$) and germane ($GeH_4$). Example conditions for such deposition include a pressure of about 250 mTorr and a temperature of no greater than 650° C. Varying the ratio of feed gases would determine the quantity of germanium atoms provided in the resultant polycrystalline deposited alloy film.

An alternate method of providing a polycrystalline alloy of silicon and germanium would be to provide germanium atoms by ion implantation into a previously deposited polycrystalline silicon layer. An example dose would be $2 \times 10^{16}$ ions/$cm^2$, with a preferred energy being in the range of 40–50 keV.

To impart increasing grain growth, the polycrystalline silicon-germanium alloy is subsequently heated to an effective temperature for an effective period of time to cause individual crystal grains within the alloy to increase their size from what they were prior to the heating step. Such is anticipated to occur through normal subsequent processing of the wafer in the production of the integrated circuitry. Regardless, an example effective temperature is from 600° C. to 1000° C. Within such a temperature range, the effective period of time will be from 30 seconds to 24 hours. Of course the higher the temperature, the lower will be the required effective time, whereas the lower the temperature the higher the required effective time. Even where germanium is ion implanted or otherwise provided in a layer of polycrystalline silicon, grain growth is maximized by the inclusion of the larger germanium atoms, which accordingly results in reduced grain boundary density.

Figure 3:
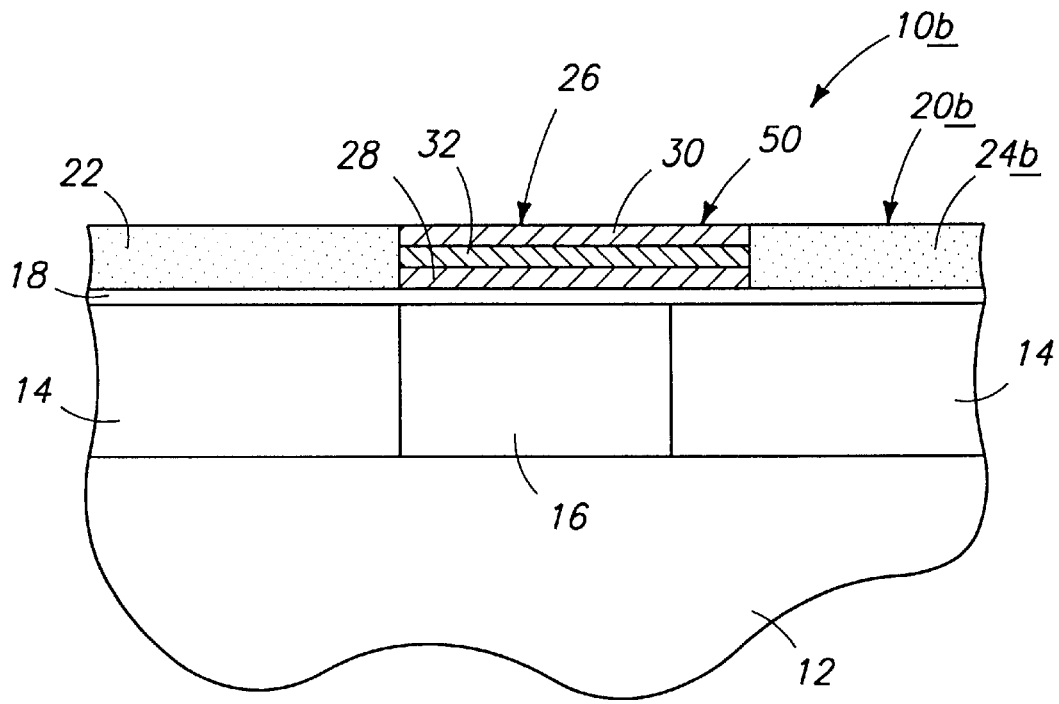
FIG. 3 is a diagrammatic side sectional view of another alternate semiconductor wafer fragment in accordance with the invention.
Figure 4:
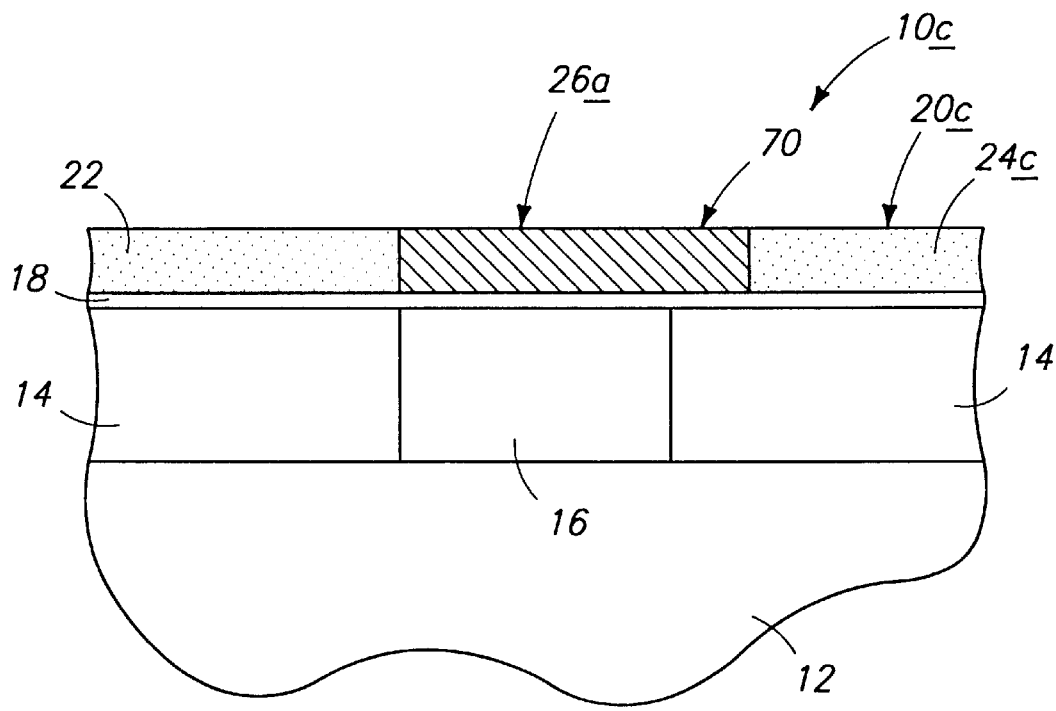
FIG. 4 is a diagrammatic side sectional view of still another alternate semiconductor wafer fragment in accordance with the invention.

FIGS. 3 and 4 show alternate embodiment thin film transistors 10b and 10c, respectively. Such comprise drain-offset regions 50 and 70, respectively. Each is positioned intermediate their associated drain region and channel region, and comprise a same material extension of their associated thin film channel region. Although shown as being un-gated, the offset regions could be constructed to be gated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A thin film transistor comprising:
   a thin film channel region intermediate a thin film source region and a thin film drain region; and
   the thin film channel region comprising a first layer consisting essentially of germanium and a second layer proximate the first layer, wherein the second layer comprises a polycrystalline silicon-germanium alloy doped with carbon.

2. A transistor channel region comprising:
   at least two distinct layers, at least one of said at least two distinct layers comprising a polycrystalline silicon-germanium alloy doped with carbon.

3. A thin film transistor comprising:
   a thin film source region;
   a thin film drain region;
   a thin film channel region intermediate the thin film source region and the thin film drain region;
   the thin film channel region comprising at least an inner layer, an outer layer and a middle layer sandwiched between the inner layer and the outer layer, the middle sandwich layer consisting essentially of germanium; and
   wherein the inner and outer layers are composed of the same material, wherein the inner and outer layers comprise a polycrystalline silicon-germanium alloy doped with carbon.

4. A thin film transistor comprising:
   a silicon semiconductor substrate;
   a thin film source region over the substrate;
   a thin film drain region over the substrate;
   a thin film channel region intermediate the thin film source region and the thin film drain region;
   the thin film channel region comprising at least an inner layer, an outer layer and a middle layer sandwiched between the inner layer and the outer layer, the middle sandwich layer consisting essentially of germanium, at least one of the inner and outer layers comprising a polycrystalline silicon-germanium alloy doped with carbon; and
   a drain-offset region intermediate the drain region and channel region, the drain-offset region comprising a same material extension of the sandwich thin film channel region.

5. The thin film transistor of claim 4 wherein both the inner layer and the outer layer comprise a polycrystalline silicon-germanium alloy doped with carbon.

6. A bottom-gated thin film transistor comprising:
   a transistor gate;
   a dielectric layer over the transistor gate and extending laterally beyond the transistor gate;
   a thin film channel region over a portion of the dielectric layer that is over the transistor gate, the thin film channel region comprising a first layer consisting essentially of germanium and a second layer proximate the first layer, wherein the second layer comprises a polycrystalline silicon-germanium alloy doped with carbon;
   a thin film source region over a portion of the dielectric layer that extends laterally beyond the transistor gate; and
   a thin film drain region over another portion of the dielectric layer that extends laterally beyond the transistor gate, the thin film channel region separating the thin film source region from the thin film drain region.

7. A bottom-gated thin film transistor comprising:
   a transistor gate;
   a dielectric layer over the transistor gate and extending laterally beyond the transistor gate;
   a thin film source region over a portion of the dielectric layer that extends laterally beyond the transistor gate;
   a thin film drain region over another portion of the dielectric layer that extends laterally beyond the transistor gate;
   a thin film channel region intermediate the thin film source region and the thin film drain region, the thin film channel region being over a portion of the dielectric layer that is over the transistor gate, the thin film channel region comprising at least an inner layer, an outer layer and a middle layer sandwiched between the inner layer and the outer layer, the middle sandwich layer consisting essentially of germanium, at least one of the inner and outer layers comprising a polycrystalline silicon-germanium alloy doped with carbon; and
   a drain-offset region intermediate the drain region and channel region, the drain-offset region comprising a same material extension of the sandwich thin film channel region.

8. The bottom-gated thin film transistor of claim 7 wherein both the inner layer and the outer layer comprise a polycrystalline silicon-germanium alloy doped with carbon.

* * * * *